United States Patent
Bayman et al.

(10) Patent No.: US 6,787,483 B1
(45) Date of Patent: Sep. 7, 2004

(54) GAP FILL FOR HIGH ASPECT RATIO STRUCTURES

(75) Inventors: Atiye Bayman, Palo Alto, CA (US); Md Sazzadur Rahman, San Jose, CA (US); Weijie Zhang, San Jose, CA (US); Bart van Schravendijk, Sunnyvale, CA (US); Vishal Gauri, San Jose, CA (US); George D. Papasoulitotis, Cupertino, CA (US); Vikram Singh, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/442,846

(22) Filed: May 20, 2003

Related U.S. Application Data

(62) Division of application No. 09/996,619, filed on Nov. 28, 2001, now Pat. No. 6,596,654.
(60) Provisional application No. 60/314,924, filed on Aug. 24, 2001.

(51) Int. Cl.[7] .......................... H01L 21/31; H01L 21/36
(52) U.S. Cl. ...................... 438/788; 438/778; 438/787; 438/791; 438/792; 438/798
(58) Field of Search ................................. 438/778, 783, 438/787, 798

(56) References Cited

U.S. PATENT DOCUMENTS

| | | |
|---|---|---|
| 5,129,958 A | 7/1992 | Nagashima et al. |
| 5,252,178 A | 10/1993 | Moslehi |
| 5,711,998 A * | 1/1998 | Shufflebotham ............ 427/535 |
| 5,834,068 A * | 11/1998 | Chern et al. ................ 427/535 |
| 6,030,881 A | 2/2000 | Papasouliotis et al. |
| 6,106,678 A | 8/2000 | Shufflebotham et al. |
| 6,184,158 B1 * | 2/2001 | Shufflebotham et al. .... 438/788 |
| 6,200,412 B1 | 3/2001 | Kilgore et al. |
| 6,232,196 B1 * | 5/2001 | Raaijmakers et al. ....... 438/386 |
| 6,395,150 B1 * | 5/2002 | Van Cleemput et al. .................... 204/192.37 |
| 6,596,653 B2 * | 7/2003 | Tan et al. ................... 438/788 |
| 6,599,829 B2 | 7/2003 | Smith et al. |
| 2002/0179570 A1 | 12/2002 | Mathad et al. |
| 2004/0082181 A1 * | 4/2004 | Doan et al. ................. 438/700 |

OTHER PUBLICATIONS

Huang et al., "Surface Treatment of Low–K SiOF to Prevent Metal Interaction," Pub No. US 2001/0044203, Pub Date Nov. 22, 2001, 6 Pages.

* cited by examiner

*Primary Examiner*—Carl Whitehead, Jr.
*Assistant Examiner*—David L. Hogans
(74) *Attorney, Agent, or Firm*—Beyer Weaver & Thomas LLP

(57) ABSTRACT

Chemical vapor deposition processes are employed to fill high aspect ratio (typically at least 3:1), narrow width (typically 1.5 microns or less and even sub 0.15 micron) gaps with significantly reduced incidence of voids or weak spots. This deposition process involves the use of hydrogen as a process gas in the reactive mixture of a plasma containing CVD reactor. The process gas also includes dielectric forming precursor molecules such as silicon and oxygen containing molecules.

24 Claims, 7 Drawing Sheets

GAP FILL FOR HIGH ASPECT RATIO STRUCTURES

CROSS-REFERENCE TO RELATED APPLICATION

This is a Divisional application of prior application Ser. No. 09/996,619 filed on Nov. 28, 2001, now U.S. Pat. No. 6,596,654, which claims priority from prior U.S. Provisional Patent Application 60/314,924, titled "GAP FILL FOR HIGH ASPECT RATIO STRUCTURES," filed Aug. 24, 2001 by Bayman et al., which is incorporated herein by reference for all purposes.

BACKGROUND OF THE INVENTION

This invention relates to electronic device fabrication processes and associated apparatus. More specifically, the invention relates to chemical vapor deposition processes for forming dielectric layers in high aspect ratio, narrow width recessed features.

It is often necessary in semiconductor processing to fill a high aspect ratio gaps with insulating material. This is the case for shallow trench isolation, inter-metal dielectric layers, passivation layers, etc. As device geometries shrink and thermal budgets are reduced, void-free filling of high aspect ratio spaces (e.g., AR>3.0:1) becomes increasingly difficult due to limitations of existing deposition processes.

Most deposition methods either deposit more material on the upper region than on the lower region of a side-wall or form cusps at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. The most problematic reentrant feature is a narrowing at the top of the gap. Thus, the etched side-walls slope inward near the top of the gap. For a given aspect ratio feature, this increases the ratio of gap volume to gap access area seen by the precursor species during deposition. Hence voids and seams become even more likely.

While some specific gap fill processes such as TEOS/ozone SACVD (sub atmospheric chemical vapor deposition) deposited BPSG provide generally good results, such processes are expiring due to incompatibility with the advanced device constraint of a maximum thermal budget of 700° C.

Going forward, the deposition of silicon dioxide assisted by high-density plasma chemical vapor deposition (HDP CVD)—a directional (bottom-up) CVD process—is the method of choice for high aspect ratio gap-fill. The method deposits more material at the bottom of a high aspect ratio structure than on its side-walls. It accomplishes this by directing charged dielectric precursor species downward, to the bottom of the gap. Thus, HDP CVD is not an entirely diffusion-based (isotropic) process.

Nevertheless, some overhang still results at the entry region of the gap to be filled. This results from the non-directional deposition reactions of neutral species in the plasma reactor and from sputtering/redeposition processes. The directional aspect of the deposition process produces some high momentum charged species that sputter away bottom fill. The sputtered material tends to redeposit on the side-walls. Thus, the formation of overhang cannot be totally eliminated and is inherent to the physics and chemistry of the HDP CVD process. Of course, limitations due to overhang formation become ever more severe as the width of the gap to be filled decreases, the aspect ratio increases, and the features become reentrant.

To improve fabrication of advanced technology devices, the art requires better dielectric deposition processes that can fill high aspect ratio features of narrow width, without leaving gaps.

SUMMARY OF THE INVENTION

This invention addresses that need by providing hydrogen as a process gas in a high density plasma CVD process. This process has been found to provide void free high-quality gap filling with dielectric materials. These benefits occur even in very narrow, high aspect ratio features.

One aspect of the invention provides a method of filling gaps on a semiconductor substrate. The method may be characterized by the following sequence: (a) providing a substrate in a process chamber of a high density plasma chemical vapor deposition reactor; (b) introducing a process gas including at least hydrogen into the process chamber, and (c) applying a bias to the substrate. This method will effectively grow a dielectric film on the semiconductor substrate via HDP CVD. This process effectively fills gaps having widths of less than about 1.5 micrometer.

The process gas preferably provides hydrogen at a flow rate of at least about 400 sccm. This value is based on a 200 millimeter substrate. Larger substrates may require correspondingly higher flow rates. The inventors have found that hydrogen flow rates in this regime provide significantly reduced side-wall dielectric redeposition during HDP CVD.

In an alternative preferred embodiment, the substrate is heated to a temperature of between about 300 and 600° C. and held in this temperature range during the deposition process. While improved results from hydrogen addition are present over a much wider range of temperatures, this temperature range in particular has been found to provide superior results.

In yet another preferred embodiment, the process gas contains substantially no noble gas (e.g., argon, helium, and/or xenon) In many conventional systems, noble gases are used as carrier gases for HDP CVD. Note that while many embodiments of this invention do in fact employ noble carrier gases, certain preferred embodiments require no noble gas.

To deposit dielectric, the carrier gas should include one or more dielectric precursors. In many commercially important embodiments, the dielectric is a silicon oxide or related material. For these embodiments, the process gas includes a volatile silicon-containing precursor, in addition to the hydrogen gas. Examples of such silicon-containing precursors include $SiH_4$, $SiF_4$, $Si_2H_6$, TEOS, TMCTS, OMCTS, methyl-silane, dimethyl-silane, 3MS, 4MS, TMDSO, TMDDSO, DMDMS and mixtures thereof. During deposition, the process decomposes the silicon-containing reactant to allow plasma phase reacting of the silicon-containing gas on the surface of the substrate.

To form silicon oxides, the process gas should also include a source of oxygen. Some silicon-containing precursors have some covalently bound oxygen (e.g., TEOS). However, additional oxygen is typically required, even for the oxygen-containing precursors. Hence, the process gas typically includes elemental oxygen or some other source of atomic oxygen such as nitrous oxide or nitric oxide.

To tailor the characteristics of the dielectric) various dopants or other modifiers may be provided. Examples of dopants include boron and phosphorus. The processes of this invention may provide these dopants via volatile phosphorus-containing process gases and/or volatile boron-containing process gases. The dielectric may also comprise a silicon oxynitride and/or a silicon oxyfluoride. Such materials may be made via processes of this invention that employ nitrogen-containing precursors (e.g., $N_2$, $N_2O$, NO, $NH_3$, $NF_3$) and/or fluorine-containing precursors.

The detailed description below will further discuss the benefits and features of this invention.

DETAILED DESCRIPTION OF THE INVENTION

Introduction

The present invention relates to chemical vapor deposition processes that can fill high aspect ratio (typically at least 3:1), narrow width (typically 1.5 microns or less and even sub 0.15 micron) gaps with significantly reduced incidence of voids or weak spots. This deposition process involves the use of hydrogen in the reactive mixture.

Even though the formation of overhang and side-wall growth can not be entirely eliminated in chemical vapor deposition reactions employing plasma, film growth on the side-wall of the gap can be minimized and bottom-up fill enhanced by minimizing the sticking probability of fragments on the side-wall of the gap. Using hydrogen in the gas mixture seems to accomplish this. The addition of hydrogen likely impacts in a positive way the plasma and/or side-wall surface chemistry and species mobility resulting in improved gap-fill. Note that this invention is not limited to any particular mechanism of action in which the hydrogen participates.

As indicated, this invention pertains to improved high density plasma (HDP) chemical vapor deposition (CVD) processes. Generally, a high density plasma is any plasma having electron density of $5 \times 10^9$ electrons per cubic centimeter. Typically, though not necessarily, high density plasma reactors operate at relatively low pressures, in the range of 100 mTorr or lower.

Figure 1A:
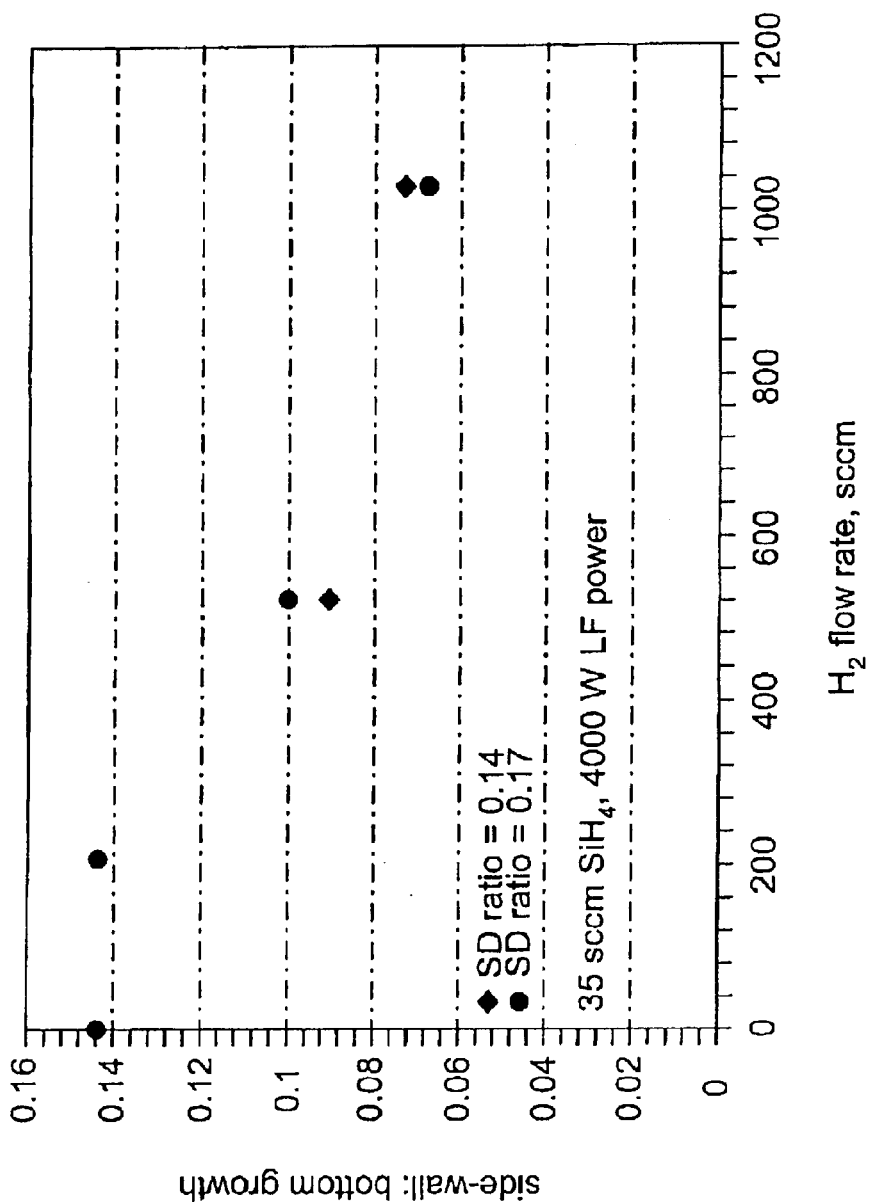
FIG. 1A is a graph showing how the ratio of side-wall to bottom dielectric growth varies with hydrogen gas flow rate.

FIG. 1A is a graph showing how the ratio of side-wall to bottom dielectric growth improves with increasing hydrogen gas flow rate. The data shown in this figure were taken from a Novellus SPEED reactor available from Novellus Systems, Inc. of San Jose, Calif. employing a low frequency (reactor electrode) power of 4000 Watts and a high frequency (substate) power of between 650 and 2900 Watts, depending on the amount of hydrogen. As the level of hydrogen was varied, the high frequency power was varied to maintain an effectively constant sputter to deposition ratio. Silicon oxide was deposited in 3.5:1 aspect ratio gaps of 0.13 micrometer widths.

Note that the data in FIG. 1A was taken for two different sets of process conditions, identified as SD ratio=0.14 and SD ratio=0.17. SD ratio refers to the sputter/deposition ratio. It is obtained by measuring the deposition rate for a given dielectric deposition process and then measuring the sputter rate for that same process performed without the silicon-containing precursor (e.g., silane). The SD ratio is given by the following expression:

$$SD = \text{sputter rate}/(\text{sputter rate} + \text{deposition rate})$$

In the FIG. 1A the process gas included, in addition to varying amounts of hydrogen, 35 sccm $SiH_4$, 47 sccm $O_2$, and 40 sccm He (except in the cases where 0 sccm $H_2$ was used, in which case 100 sccm He was used). The deposition reaction proceeded under these conditions to a thickness of about 1550 Angstroms silicon dioxide measured at the field regions on a 200 millimeter wafer.

As shown in the graph, the ratio of side-wall to bottom growth dielectric thickness attained a maximum of slightly over 0.14 for process gases including either no hydrogen or 200 sccm hydrogen. When 500 sccm hydrogen was introduced (together with the other gases), the ratio dropped to about 0.1. And when 1000 sccm hydrogen was utilized, the ratio dropped further to about 0.065. Clearly, the presence of hydrogen in the process reduces the relative amount of side-wall deposition.

Figure 1B:
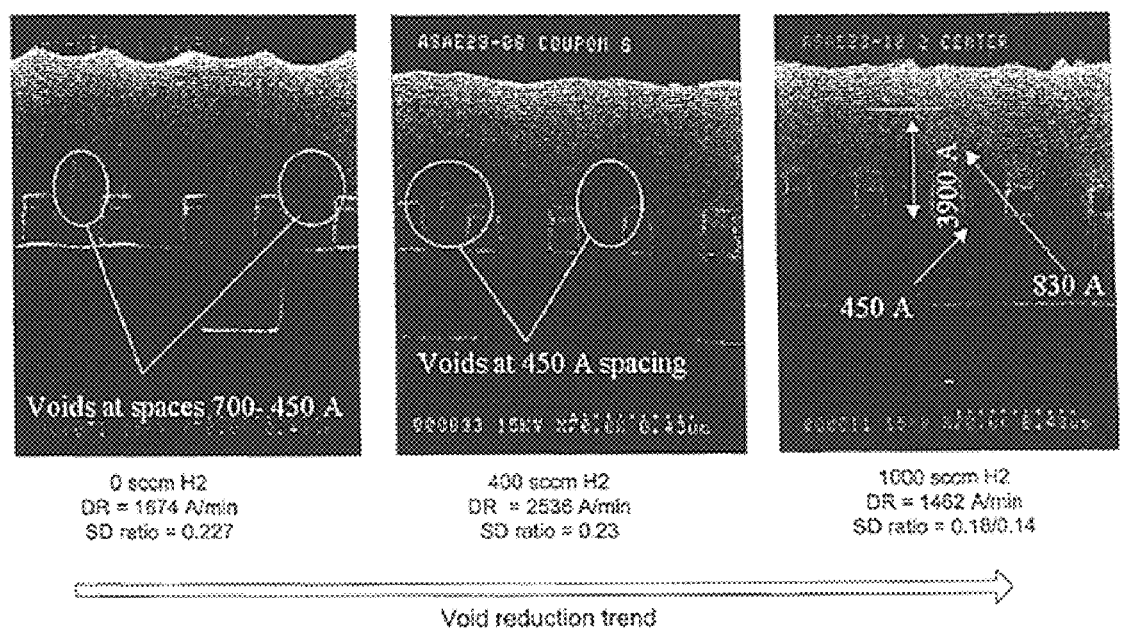
FIG. 1B presents 3 micrographs showing successively decreased void formation with increasing hydrogen gas flow rate.

FIG. 1B presents 3 micrographs showing successively decreased void formation with increasing hydrogen gas flow rate. For each of the three micrographs, the following process conditions were employed.

Left-most structure: 0 sccm hydrogen, 180 sccm helium, 60 sccm silane, 78 sccm oxygen, 2500 Watts low frequency power, and 1200 Watts high frequency power.

Middle structure: 400 sccm hydrogen, 40 sccm helium, 72 sccm silane, 94 sccm oxygen, 4000 Watts low frequency power, and 4200 Watts high frequency power.

Right-most structure: 1000 sccm hydrogen, 40 sccm helium, 45 sccm silane, 62 sccm oxygen, 4000 Watts low frequency power, and 3800 Watts high frequency power.

As can be seen, the voids left from the 400 sccm hydrogen process are significantly smaller than those left from the 0 sccm hydrogen process. Further, the voids essentially disappear when 1000 sccm hydrogen was employed.

Figure 2A:
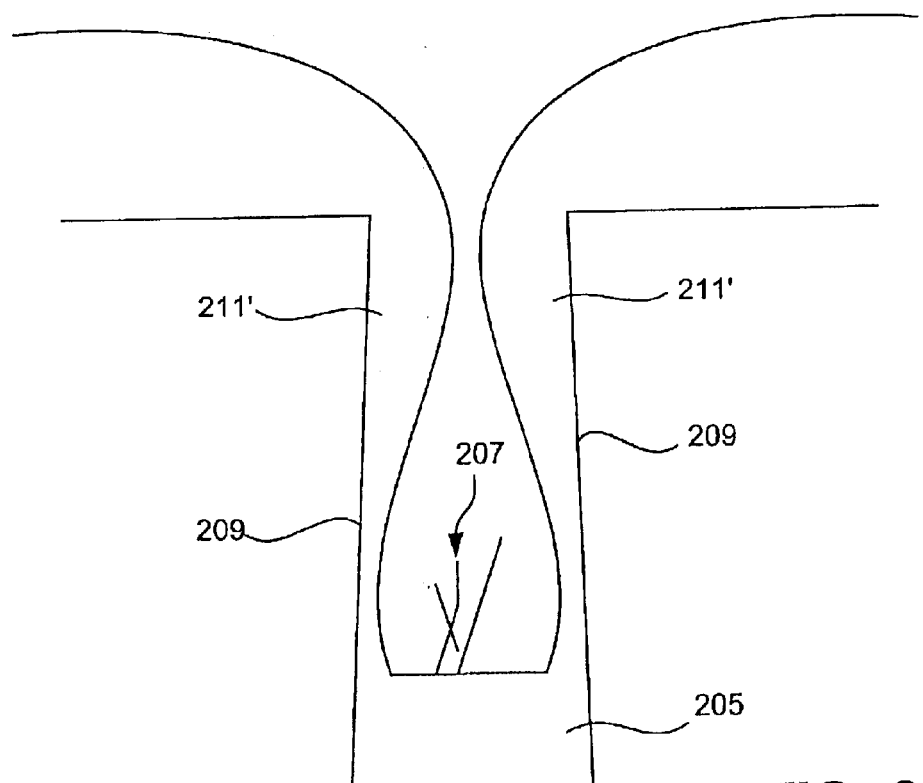
FIG. 2A is a rough schematic cross-sectional diagram of a trench or via having problematic sidewall deposition of dielectric during HDP CVD.
Figure 2B:
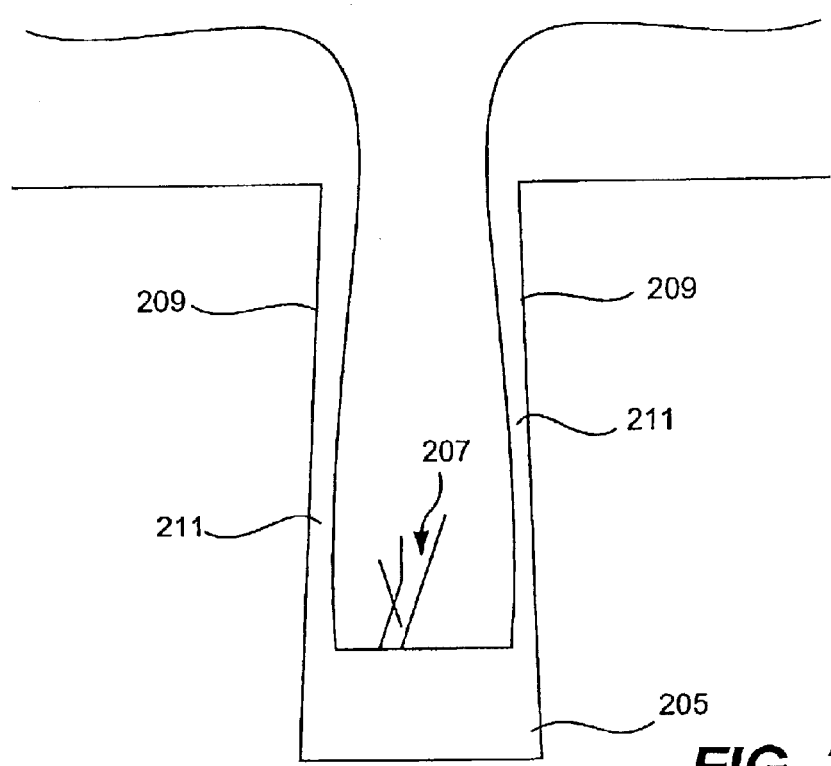
FIG. 2B is a rough schematic cross-sectional diagram of a trench or via (as in FIG. 2A) having much less side-wall deposition of dielectric because the dielectric was grown with a hydrogen containing process gas.
Figure 3:
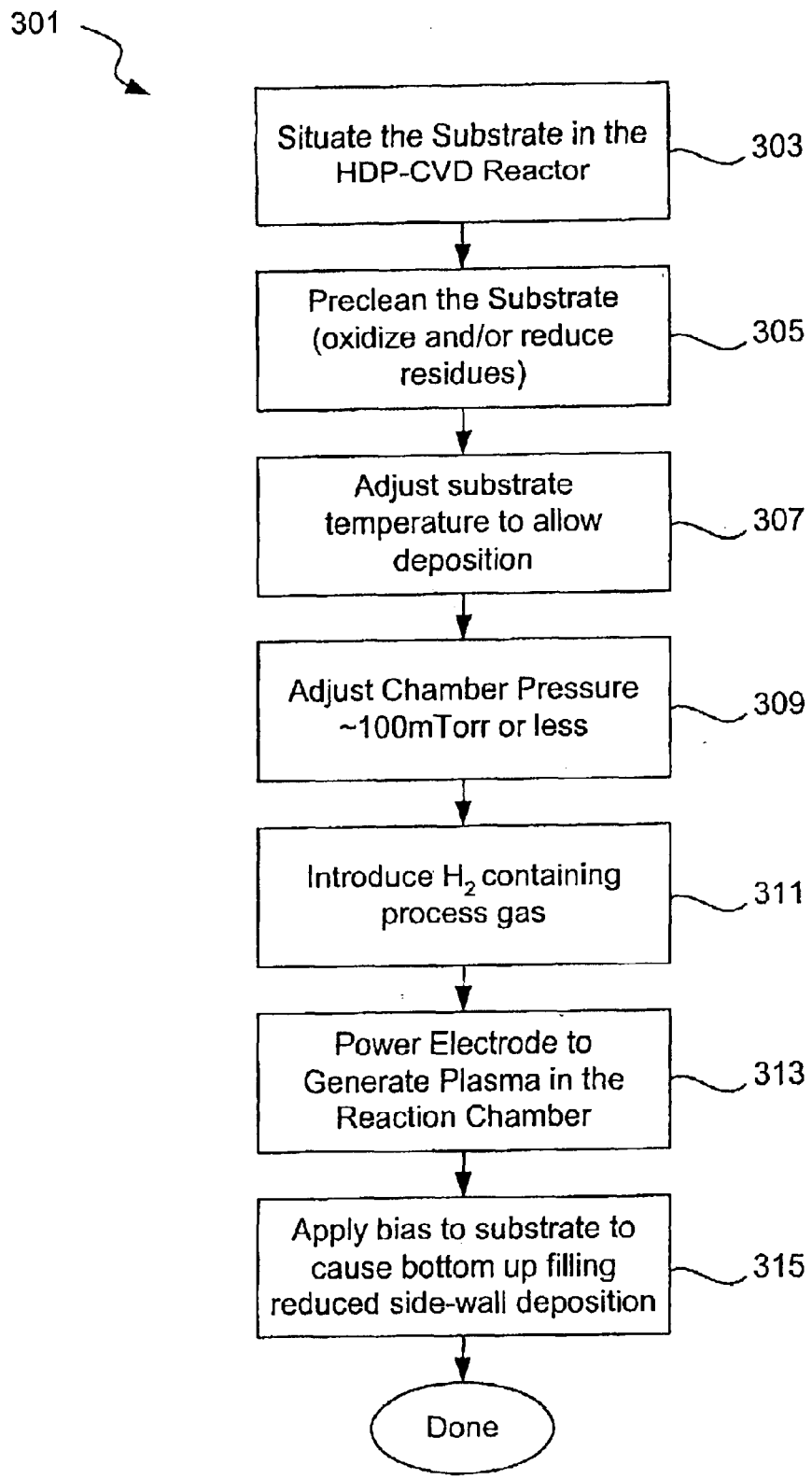
FIG. 3 is a process flow diagram depicting a process context of the present invention.

FIGS. 2A and 2B show in rough schematic fashion the variation in side-wall deposition that can be expected in a trench filled without hydrogen containing process gas (FIG. 2A) and with hydrogen containing process gas (FIG. 2B). In both cases, a HDP CVD process provides a bottom fill. And in both cases, dielectric material 205 from the bottom of the trench is sputtered by high momentum species from the plasma. Sputtered dielectric 207 flies out toward the side-walls 209. In the case of hydrogen containing process gas, the sputtered species do not significantly contribute to the growing side-wall coverage (dielectric) 211. In the case of hydrogen-free process gas, however, side-dielectric 211' rapidly grows in a lateral direction due to redeposition of the sputtered species 207. Dielectric also deposits on the field regions A general process context for the gap filling technology of this invention is depicted FIG. 3. As shown, a deposition process 301 begins at block 303 with a device (often a robot arm) delivering a substrate to a process chamber of a high-density plasma chemical vapor deposition reactor. Subsequently, the process will deposit dielectric on the substrate. Providing the substrate to the reactor may involve clamping the substrate to a pedestal or other support in the chamber. For this purpose, an electrostatic or mechanical chuck may be employed.

After the wafer is appropriately situated in the chamber, the process provides a preclean operation. See block 305. This is intended to remove polymer or other residues in the gap prior to the dielectric film growing. Preferably, this is accomplished with a plasma phase reaction of at least one of an oxygen-containing gas and a hydrogen-containing gas. Oxygen is used for species that require oxidation and hydrogen is used for species that require reduction.

After the substrate has been appropriately cleaned, various other operations associated with dielectric deposition are performed. These operations are represented by reference numbers 307, 309, 311, 313, and 315. These operations may be performed sequentially in the order shown or in some other order. In addition, some or all of these operations may be performed concurrently, as they are implemented by different subsystems of the reactor.

In block 307, the process adjusts the substrate temperature to a level promoting the deposition of the dielectric layer. Typically, this temperature is between about 30–1000° C. (more preferably about 300 to 600° C.). The temperature control mechanism may gradually raise the temperature during deposition or it may preheat the wafer to first drive out certain interfering species. During deposition, the temperature may be maintained by supplying a heat transfer gas between a back surface of the substrate and a surface of the substrate holder on which the substrate is supported during the film growth operation.

At block 309, the process adjusts the pressure of the process chamber to a level suitable for the HDP CVD reaction. In some specific embodiments, this pressure is not greater than about 100 mTorr. The pressure should allow relatively rapid deposition while maintaining a high density plasma under the applied frequency and power.

At block 311, the reactor system introduces a process gas to the reaction chamber via an inlet. The process gas includes dielectric precursor species such as high vapor pressure silicon-containing compounds and dopant precursors. Molecular oxygen or another oxygenated compound will often be present. Sometimes, though not necessarily, an inert carrier gas is present. Importantly, the introduced process gas also includes molecular elemental hydrogen. All the process gas components are introduced at specified flow rates.

At block 313, an electrical subsystem applies electrical energy of appropriate power and frequency to one or more electrodes of the reaction chamber. The power and frequency are chosen to generate a high-density plasma in the chamber, given the process gas concentration, pressure, and other process parameters.

Finally, at 315, an electrical subsystem applies a bias to the substrate, to thereby direct charged precursor species from the plasma onto the substrate and grow a dielectric film. Note that the substrate itself serves as an electrode here. Its bias accelerates charged species to it. Typically, the substrate electrode is powered by a high frequency rf bias and the other electrode is powered by a lower frequency rf source.

When the dielectric layer is deposited on the substrate to a desired thickness via the high density plasma chemical vapor deposition, the process is complete. After evacuating the chamber and adjusting the temperature and pressure as appropriate, the substrate may be removed for further processing.

HDP-CVD Reactors

Various plasma reactor designs are suitable for use with this invention. The particular design is not critical to this invention. It merely needs to support HDP CVD dielectric layer formation on appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes to generate a plasma and a bias source for the substrate. A temperature control system is typically used to heat the substrate.

Figure 4:
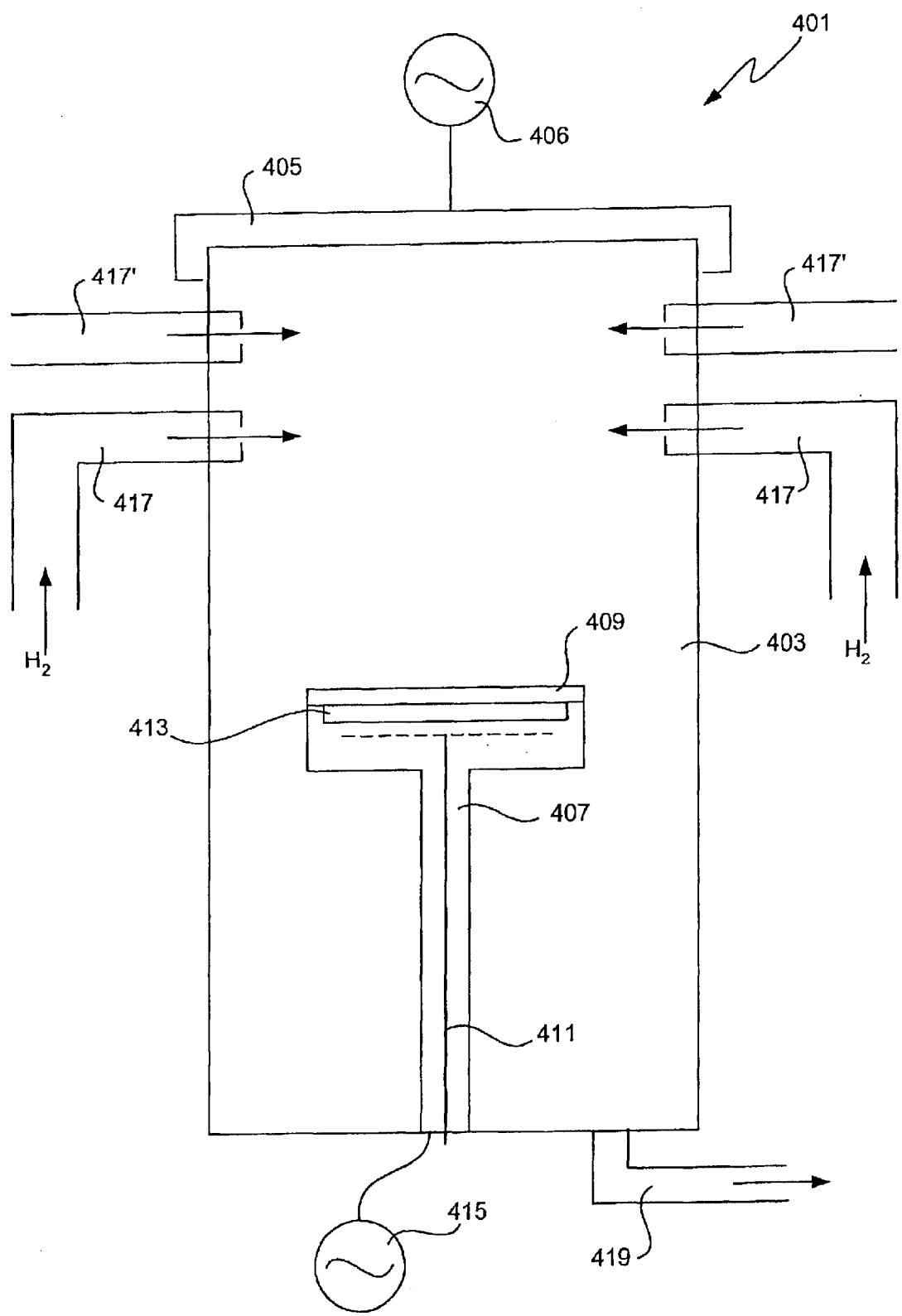
FIG. 4 is a block diagram depicting some components of a suitable CVD reactor for performing HDP CVD in accordance with this invention.

FIG. 4 provides a simple block diagram depicting various reactor components arranged as in a conventional reactor. As shown, a reactor 401 includes a process chamber 403 which encloses other components of the reactor and serves to contain the plasma generated by an electrode 405. In one example, the process chamber walls are made from aluminum, aluminum oxide, and/or other suitable material. Electrode 405 is powered by a "low frequency" rf source 406. The power and frequency supplied by source 406 is sufficient to generate high-density plasma from the process gas.

Within the reactor, a wafer pedestal 407 supports a substrate 409. The pedestal typically includes a chuck to hold the substrate in place during the deposition reaction. The chuck may be an electrostatic chuck, a mechanical chuck or various other types of chuck as are available for use in the industry and/or research.

A heat transfer subsystem including a line 411 for supplying a heat transfer fluid controls the temperature of substrate 409. In some embodiments, the heat transfer fluid comprises at least one of helium and argon gas. Water or other liquid is used in other embodiments. The heat transfer fluid is supplied to a space 413 between the surface of the substrate and a surface of the chuck.

A "high frequency" rf source 415 serves to electrically bias substrate 409 and draw charged precursor species onto the substrate for the deposition reaction. Electrical energy from source 415 is coupled to substrate 409 via an electrode or capacitive coupling, for example. Note that the bias applied to the substrate need not be an rf bias. Other frequencies and DC bias may be used as well. In a specific embodiment, source 415 supplies a radio frequency bias to the substrate, and the radio frequency bias is generated by supplying the electrode with at least 0.2 W/cm$^2$ of power.

The process gases are introduced via one or more inlets 417 and 417'. The gases may be premixed or not. A source of elemental hydrogen gas provides hydrogen for the process gas. Other sources of precursor gases and carrier gases may also be provided. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixture may be introduced from a primary gas ring, which may or may not direct the gas toward the substrate surface. Injectors may be connected to the primary gas ring to direct at least some of the gas or gas mixture into the chamber and toward substrate. Note that injectors, gas rings or other mechanisms for directing process gas toward the wafer are not critical to this invention. The sonic front caused by the gas entering the chamber will itself cause the gas to rapidly disperse in all directions—including toward the substrate.

The process gas exits chamber 403 via an outlet 419. A vacuum pump (e.g., a turbomolecular pump) typically draws the gas out and maintains a suitably low pressure within the reactor.

Process Parameters

The process gas itself will have a particular composition. Each component will be present at a particular level. Typically, the composition is represented by flow rates of the constituent gases in units of standard cubic centimeter per minute (sccm).

In all embodiments of this invention, elemental hydrogen is introduced into the chamber as a process gas. The process gas will also include a precursor for the deposition layer. If the dielectric is a silicon-containing dielectric, then the process gas will include a silicon-bearing compound such as $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof During deposition, the process decomposes the silicon-containing reactant to form a silicon-containing gas and plasma phase species, which can react on the surface of the substrate.

Oxygen to form the silicon oxide or other dielectric material may be provided by the silicon-containing precursor itself or from another process gas such as elemental oxygen($O_2$), nitric oxide (NO), and/or nitrous oxide ($N_2O$).

Typical flow rate ranges for process gases of the present invention are listed below.

| Gas | Flow Rate (sccm) |
|---|---|
| $SiH_4$ | 10–250 |
| $O_2$ | 10–1000 |
| $H_2$ | 10–5000 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 5 and 125 sccm.

Note also that the presence of hydrogen in the process gas may require that the ratio of oxygen containing precursor to silicon-containing precursor be adjusted upward (in comparison to a standard hydrogen-free process), as hydrogen reacts with and removes the oxygen from the deposition reaction. Regardless of this process variation, it has been found that the presence of hydrogen in the process gas does not detrimentally affect the physical and material properties of the deposited dielectric film.

In preferred embodiments, the flow rate of hydrogen employed is at least about 200 sccm, and more preferably at least about 400 sccm, and most preferably at least about 500 sccm—all based on a 200 millimeter substrate. Larger substrates require higher flow rates. The flow rate may vary somewhat when special injector configurations are employed.

In certain preferred embodiments, the invention is practiced with processes gases containing substantially no noble gas (e.g., argon, helium, or xenon). Other embodiments of the present invention, however, include the use of noble gas carriers such as argon, helium, and/or xenon. The use of noble gases can be practiced under the conditions of the above-described embodiments.

For doped dielectrics (particularly silicon dioxide based dielectrics), the process gas may include a dopant precursor such as a boron-containing gas, a phosphorus-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include the following: $B_2H_6$ and $PH_3$.

If the dielectric is to contain an oxyfluoride (e.g., silicon oxyfluoride), then the process gas preferably includes a fluorine-containing reactant such as silicon hexafluoride. If the dielectric is to contain an oxynitride (e.g., silicon oxynitride), then the process gas preferably includes a nitrogen-containing reactant such as $N_2$, $NTH_3$, $NF_3$, NO, $N_2O$, and mixtures thereof.

Reactor pressure is held at a value necessary to sustain the high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700–750° C. Such constraints become increasingly common with advanced technologies and corresponding smaller feature sizes. For such applications, the process temperature is preferably maintained between about 30 and 750° C. In particularly preferred embodiments, the substrate temperature is maintained between about 300 and 600° C., even more preferably between about 350 and 450° C.

As indicated, to control the substrate temperature, the reactor may supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0–15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The low frequency power applied to the upper electrode (for generating the plasma) typically varies from 1 kW to 20 kW, and the high frequency power (for biasing the wafer)

typically reaches at least about 0.2 W/cm² (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

Substrates and Dielectric Materials

The above-described processes and apparatuses may deposit dielectric on any type of substrate that requires thin dielectric layers. Often, the substrate will be a semiconductor wafer having gaps in need of dielectric filling. The invention is not, however, limited to such applications. It may be employed in a myriad of other fabrication processes such as for fabricating flat panel displays.

As indicated above, this invention finds particular value in integrated circuit fabrication. The gap filling processes are performed on partially fabricated integrated circuits employing semiconductor substrates. In specific examples, the gap filling processes of this invention are employed to form shallow trench isolation, inter-metal dielectric layers, passivation layers, etc.

As indicated, the invention can effectively fill gaps having widths of 1.5 micrometers or less and aspect ratios of 3:1 or greater. More aggressive structures having, e.g., greater aspect ratios and smaller widths may also be used. In one example the gap width is 0.15 micrometers or less.

The dielectrics employed to fill those gaps will often be a silicon oxide such as silicon dioxide, silicon oxynitride, silicon oxyfluoride, and doped variants of each of these. Therefore, the scope of the invention includes at least fluorine-doped, phosphorus-doped, boron-doped, and boron/phosphorus-doped oxides. As indicated, the dielectric may also be a phosphorus- and boron-doped silicon oxide glass (BPSG).

EXAMPLES

To test the hydrogen gas process, dielectric was deposited on 622 separate wafers using hydrogen containing process gas. The process parameters were as follows:

$SiH_4$ 35 sccm $O_2$ 65 sccm

He 40 sccm $H_2$ 1000 sccm

LF Power 4000 Watts

HF Power 3000 Watts

Depo. Time 193 seconds

Under these conditions, it was found that the overall film thickness and refractive index were remarkably consistent from wafer to wafer. Further, the film thickness was found to vary by no more than about 2% within the wafer. And the film refractive index was found to vary by no more than about 0.1% within the wafer.

Figure 5:
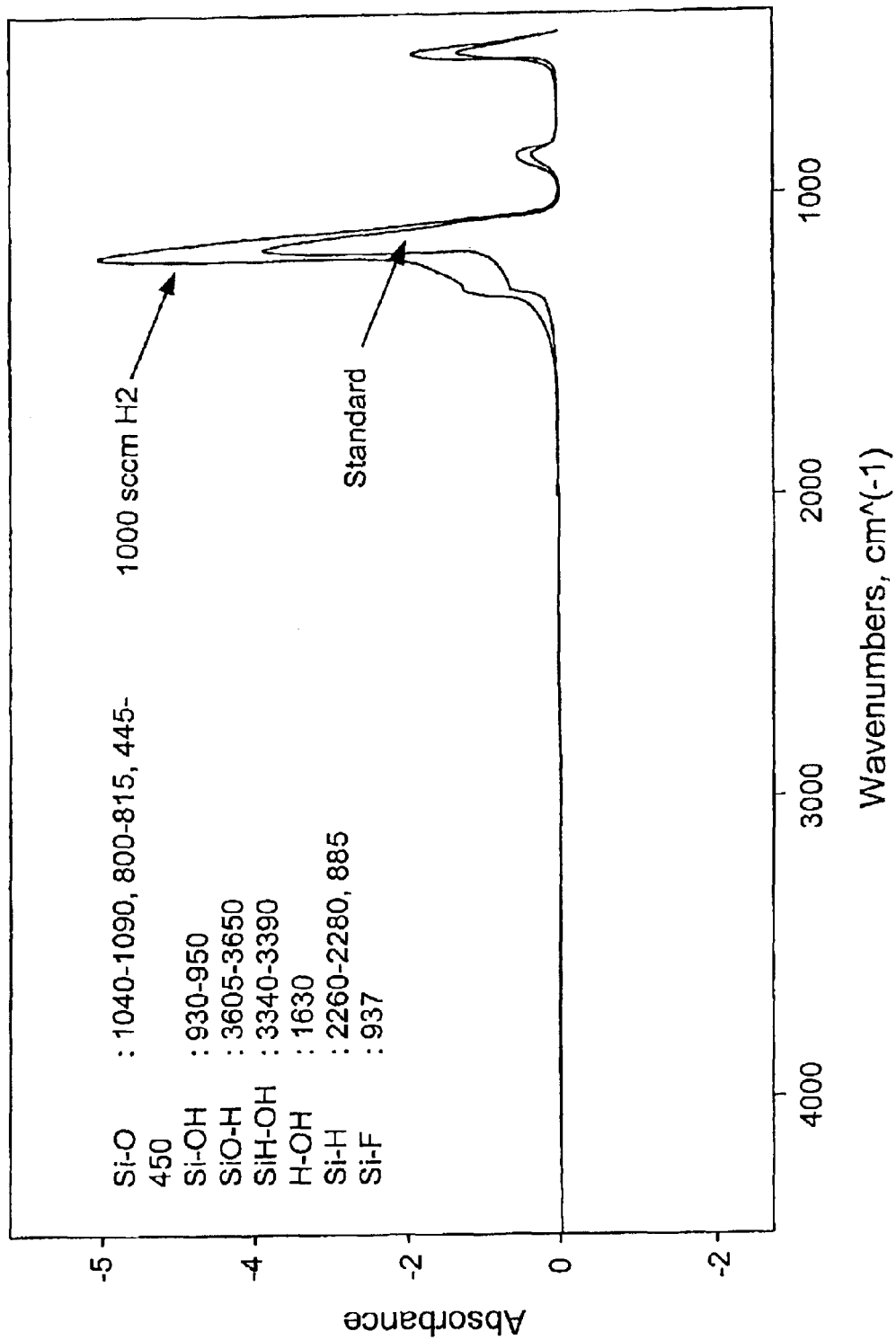
FIG. 5 presents FTIR absorption spectra for silicon oxide dielectrics deposited by processes with and without hydrogen process gas.

FIG. 5 shows an FTIR absorbance spectrum of a dielectric film deposited by a standard process (lower curve) and a hydrogen containing process (upper curve). Importantly, both curves have peaks at the same spectral locations and the ratios of those peaks (upper curve:lower curve) are identical. Also, note that there are no peaks associated with Si—H, $H_2O$, or SiO—H. Each of these detrimental species could potentially form when hydrogen is present. The films were deposited using the conditions listed above.

Figure 6:
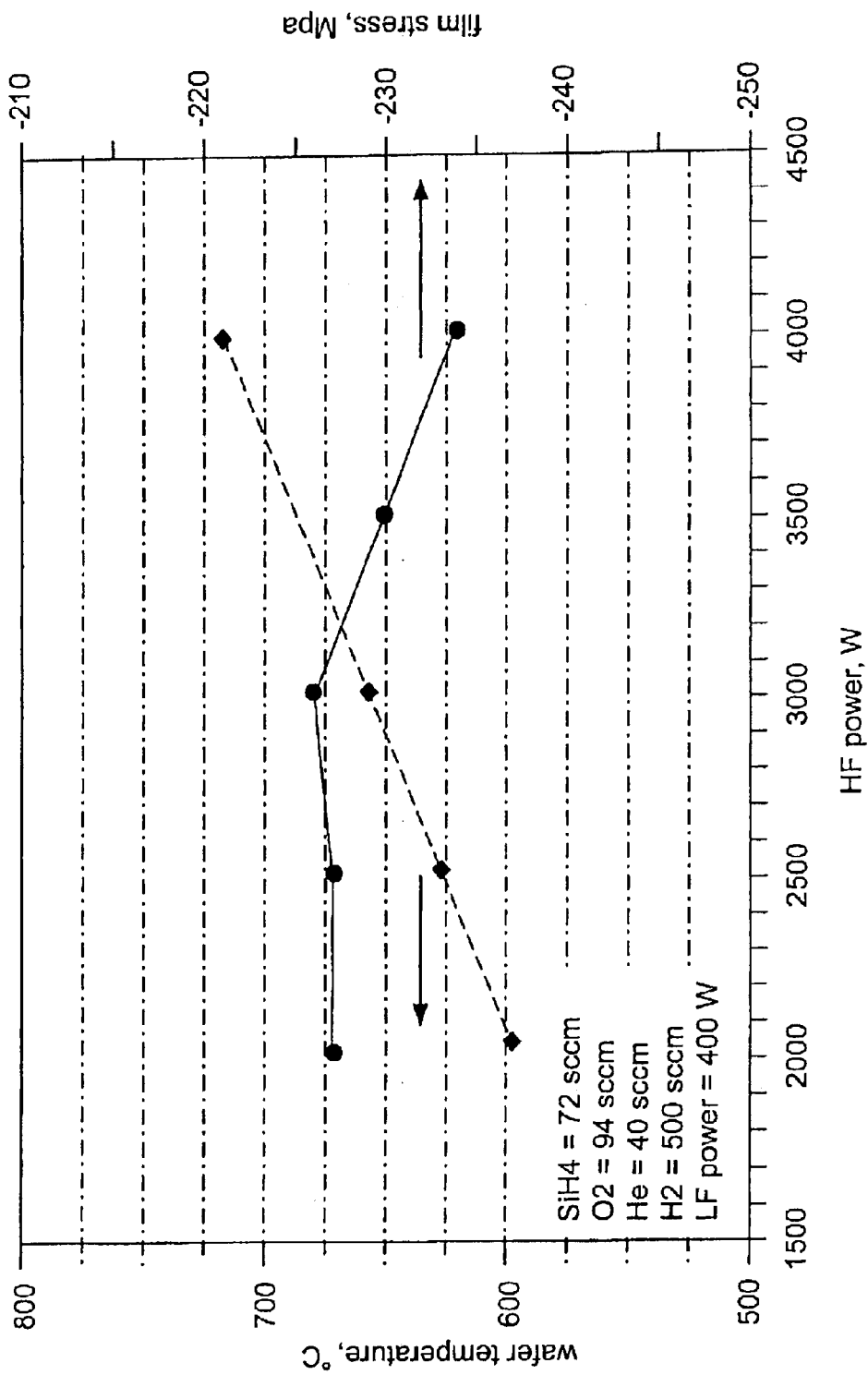
FIG. 6 is a graph showing that dielectric in-film stress is not compromised by employing hydrogen containing process gas.

FIG. 6 shows in-film stress measurements for dielectric films deposited under the following conditions: $SiH_4$=72 sccm, $O_2$=94 sccm, He=40 sccm, $H_2$=500 sccm, and low frequency power=4000 Watts. As shown, the film stress remains at about 230 MPa over a wide range of wafer temperatures (used in during processing). These numbers are consistent with those derived by standard chemistry processes.

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of filling gaps on a semiconductor substrate, the method comprising
   providing a substrate in a process chamber of a high density plasma chemical vapor deposition reactor;
   introducing a process gas comprising hydrogen in an amount of at least about 200 sccm, based on a 200 millimeter substrate, into the process chamber, wherein the process gas is substantially free of noble gas; and
   applying a bias to the substrate, to thereby grow a dielectric film via high density plasma chemical vapor deposition on the semiconductor substrate, wherein the dielectric film fills gaps with a width of less than about 1.5 micrometer.

2. The method of claim 1, wherein the process gas further comprises a silicon-bearing compound selected from the group of $SiH_4$, $SiF_4$, $Si_2H_6$, TEOS, TMCTS, OMCTS, methyl-silane, dimethyl-silane, 3MS, 4MS, TMDSO, TMDDSO, DMDMS and mixtures thereof, said process further comprising decomposing the silicon-containing compound to allow plasma phase reacting of a silicon-containing reactant on the surface of the substrate.

3. The method of claim 2, wherein the process gas further comprises a reactant selected from the group consisting of $N_2$, $N_2O$, NO, $NH_3$, $NF_3$, $O_2$, and mixtures thereof.

4. The method of claim 3, wherein the process gas comprises a reactant selected from the group of boron-containing gas, phosphorus-containing gas, and mixtures thereof.

5. The method of claim 1, wherein the process chamber is maintained at a pressure of not more than about 100 mTorr.

6. The method of claim 1, wherein the high-density plasma chemical vapor deposition reactor comprises an electrode that generates a plasma from the process gas.

7. The method of claim 1, wherein the bias applied to the substrate is a radio frequency bias.

8. The method of claim 7, wherein applying a bias to the substrate comprises supporting the substrate on a substrate holder having an electrode supplying a radio frequency bias to the substrate, the radio frequency bias being generated by supplying the electrode with at least 0.2 W/cm² of power.

9. The method of claim 7, wherein the radio frequency bias applied to the substrate is at the frequency range of between about 100 kHz and 27 MHz.

10. The method of claim 1, wherein the substrate is placed on placed on a substrate holder that is maintained at a temperature of between about 30 and 1000° C.

11. The method of claim 1, further comprising supplying a heat transfer gas between a surface of the substrate and a surface of the substrate holder on which the substrate is supported during the film growing.

12. The method of claim 11, further comprising clamping the substrate on an electrostatic or mechanical chuck during the film growing.

13. The method of claim 12, wherein the heat transfer gas comprises at least one of helium and argon and is supplied to a space between the surface of the substrate and a surface of the chuck.

14. The method of claim 1, further comprising plasma phase reacting at least one of an oxygen-containing gas and a hydrogen-containing gas in the gaps and removing polymer residues in the gap prior to the film growing.

15. The method of claim 1, wherein the dielectric film comprises a silicon oxide.

16. The method of claim 1, wherein the dielectric film comprises $SiO_2$.

17. The method of claim 1, wherein the gas includes silicon and fluorine-containing reactants and the dielectric film comprises silicon oxyfluoride.

18. The method of claim 1, wherein the gas includes nitrogen-containing reactants and the dielectric film comprises silicon oxynitride.

19. The method of claim 1, wherein the gas includes phosphorus-containing reactants and the dielectric film comprises phosphorus-doped silicon oxide.

20. The method of claim 1, wherein the gas includes boron-containing reactants and the dielectric film comprises boron-doped silicon oxide.

21. The method of claim 1, wherein the gas includes boron-containing reactants and phosphorus-containing reactants and the dielectric film comprises phosphorus- and boron-doped silicon oxide (BPSG).

22. The method of claim 1, wherein the process gas is introduced through a gas supply including orifices, at least some of the orifices orienting the process gas along an axis of injection intersecting an exposed surfaced of the substrate at an acute angle.

23. The method of claim 22, wherein introducing the process gas comprises supplying a gas or gas mixture from a primary gas ring, wherein at least some of said gas or gas mixture is directed toward said substrate.

24. The method of claim 23, wherein injectors are connected to said primary gas ring, the injectors injecting at least some of said gas or gas mixture into said chamber and directed toward substrate.

* * * * *

UNITED STATES PATENT AND TRADEMARK OFFICE
CERTIFICATE OF CORRECTION

PATENT NO. : 6,787,483 B1
DATED : September 7, 2004
INVENTOR(S) : Bayman et al.

It is certified that error appears in the above-identified patent and that said Letters Patent is hereby corrected as shown below:

Title page,
Item [75], Inventors, change "George D. Papasoulitotis" to -- George D. Papasouliotis --.

Signed and Sealed this

Fifteenth Day of February, 2005

JON W. DUDAS
*Director of the United States Patent and Trademark Office*